United States Patent
Mohammed et al.

(10) Patent No.: US 8,652,935 B2
(45) Date of Patent: Feb. 18, 2014

(54) VOID-FREE WAFER BONDING USING CHANNELS

(75) Inventors: Ilyas Mohammed, Santa Clara, CA (US); Piyush Savalia, Santa Clara, CA (US); Craig Mitchell, San Jose, CA (US); Vage Oganesian, Palo Alto, CA (US); Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 337 days.

(21) Appl. No.: 12/970,529

(22) Filed: Dec. 16, 2010

(65) Prior Publication Data

US 2012/0153426 A1    Jun. 21, 2012

(51) Int. Cl.
*H01L 21/30* (2006.01)

(52) U.S. Cl.
USPC .................................. 438/455; 257/E21.122

(58) Field of Classification Search
USPC ................................................. 438/455–459
See application file for complete search history.

(56) References Cited

U.S. PATENT DOCUMENTS

| | | | |
|---|---|---|---|
| 5,763,288 A | 6/1998 | Sakaguchi et al. | |
| 6,174,751 B1 | 1/2001 | Oka | |
| 6,649,445 B1 | 11/2003 | Qi et al. | |
| 7,221,059 B2 | 5/2007 | Farnworth et al. | |
| 7,282,104 B2 | 10/2007 | Bonvalot et al. | |
| 7,413,927 B1 | 8/2008 | Patwardhan et al. | |
| 7,754,581 B2 | 7/2010 | Ikeda et al. | |
| 2001/0002330 A1* | 5/2001 | Benenati et al. | 438/613 |
| 2001/0013641 A1 | 8/2001 | Onodera et al. | |
| 2003/0148593 A1* | 8/2003 | Okamoto et al. | 438/455 |
| 2006/0220259 A1 | 10/2006 | Chen et al. | |
| 2008/0220564 A1 | 9/2008 | Mahler et al. | |
| 2009/0079060 A1 | 3/2009 | Bartley et al. | |
| 2011/0042797 A1 | 2/2011 | Park et al. | |

OTHER PUBLICATIONS

International Search Report dated Jul. 9, 2012 for Application No. PCT/US2011/064884.
International Search Report dated Mar. 21, 2012 for Application No. PCT/US2011/064884.

* cited by examiner

*Primary Examiner* — Brook Kebede
(74) *Attorney, Agent, or Firm* — Lerner, David, Littenberg, Krumholz & Mentlik, LLP

(57) ABSTRACT

A method of bonding first and second microelectronic elements includes pressing together a first substrate containing active circuit elements therein with a second substrate, with a flowable dielectric material between confronting surfaces of the respective substrates, each of the first and second substrates having a coefficient of thermal expansion less than 10 parts per million/° C., at least one of the confronting surfaces having a plurality of channels extending from an edge of such surface, such that the dielectric material between planes defined by the confronting surfaces is at least substantially free of voids and has a thickness over one micron, and at least some of the dielectric material flows into at least some of the channels.

27 Claims, 16 Drawing Sheets

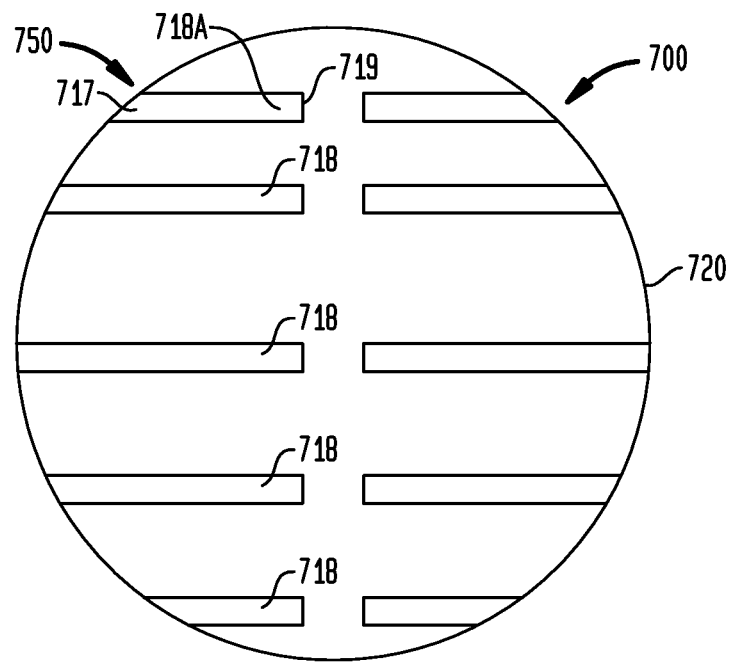
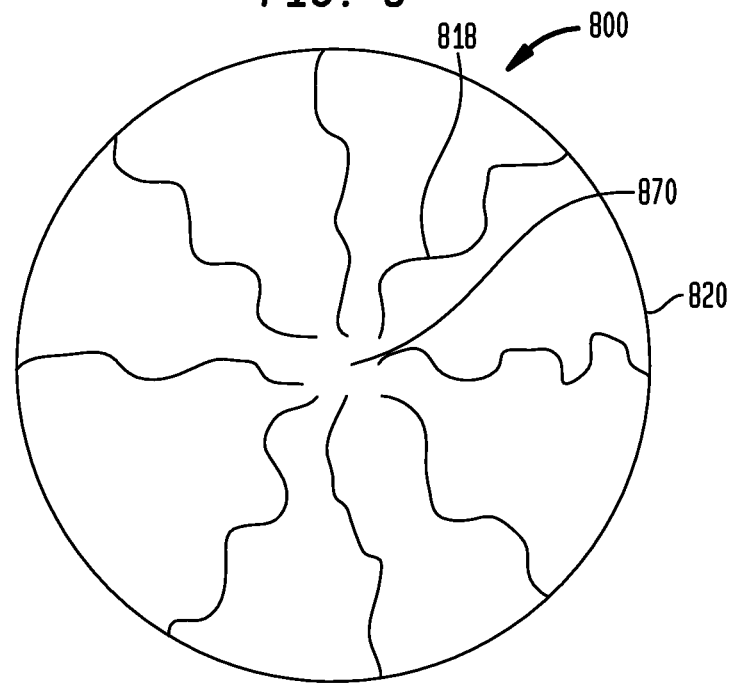

VOID-FREE WAFER BONDING USING CHANNELS

FIELD OF INVENTION

The present invention relates to the fabrication of microelectronic assemblies or units containing a plurality of microelectronic elements, and more specifically to a method of bonding of microelectronic elements together, the microelectronic elements which can be substrates such as wafers containing a plurality of chips, and the substrates which may contain at least a layer of semiconductor material and at least one of active or passive devices.

BACKGROUND OF THE INVENTION

In the construction of semiconductor chips, it may be necessary to bond two or more substrates together. Conventional methods of bonding require the application of a bonding material or an adhesive layer between two substrates, such as wafers, and then curing of the bonding material. Upon curing, the properties of the bonding material enable the first and second wafers to be joined and secured together. While the use of a bonding material to bond the first and second wafers provides a relatively inexpensive form of bonding, such use presents at least one major drawback. Air often gets trapped in the bonding material, such that pockets of air or voids are created within the bonding material. This causes the thickness of the adhesive to vary at certain points along the respective wafers. Air voids present within the wafer will provide for a thicker adhesive material on one portion of the wafer as compared to another portion of the wafer where the bonding material may be nonexistent. As a result, the bond strength across all chips in the wafer is not uniform, with the bond strength being less where the voids are present. Moreover, the overall bond between the bonding material and wafer is therefore reduced.

Various methods have been devised to improve upon these shortcomings. Nevertheless, despite all of the effort which has been devoted to improving bonding, there are unmet needs for further improvements.

SUMMARY OF THE INVENTION

In one aspect of the present invention, there is a method of bonding first and second microelectronic elements that includes pressing together a first substrate containing active circuit elements therein and a second substrate. A flowable dielectric material may be disposed between confronting surfaces of the respective substrates. The first and second substrates may have a coefficient of thermal expansion less than 10 parts per million/° C. At least one of the confronting surfaces may have a plurality of channels extending from an edge of such surface, such that the dielectric material between planes defined by the confronting surfaces has a thickness over one micron. At least some of the dielectric material may flow into at least some of the channels.

In another embodiment of this aspect of the present invention, the method further includes after the step of pressing together, placing the first and second substrates in a chamber with the flowable dielectric material therebetween and evacuating air from the chamber. This allows the removal of air within at least one of the flowable dielectric material or the channels.

In another embodiment of this aspect of the present invention, before the step of pressing together, first and second substrates may be placed in a chamber with the flowable dielectric material contacting at least one of the confronting surfaces, and air may be evacuated from the chamber.

In another embodiment of this aspect of the present invention, the first substrate may have a contact-bearing surface remote from the confronting surfaces.

In another embodiment of this aspect of the present invention, the confronting surface of the first substrate is a contact-bearing surface thereof.

In another embodiment of this aspect of the present invention, the second substrate may contain active circuit elements therein. Alternatively, the second substrate may have a contact-bearing surface facing away from the surface having the channels. The plurality of channels may be disposed in dicing lanes of the second substrate.

In another embodiment of this aspect of the present invention, after the pressing step, at least some of the plurality of channels are only partially filled with the flowable dielectric material.

In another embodiment of this aspect of the present invention, the dielectric material may include an adhesive or it may include a partially cured dielectric material. Alternatively, after the pressing step, the flowable dielectric material may be cured.

In another embodiment of this aspect of the present invention, at least some channels have first and second ends each exposed at least one edge of the second substrate. Alternatively, at least two of the plurality of channels may intersect.

In another embodiment of this aspect of the present invention, the microelectronic elements may have a rectangular shape having a plurality of edges, and at least some channels may extend to at least some of the plurality of edges.

In another embodiment of this aspect of the present invention, the microelectronic elements are wafers having a shape which is at least essentially circular, wherein at least some channels extend to the edge of the wafers.

In another aspect of the present invention, an in-process unit may include first and second microelectronic elements that have confronting surfaces defining respective planes and a dielectric material filling a space between the planes. At least one of the confronting surfaces may have a plurality of channels extending from an edge of the respective surface. The dielectric material may have a thickness over one micron in the space between the planes and may be disposed in at least some of the channels without filling all of the channels.

In another embodiment of this aspect of the present invention, a depth of the channels from the confronting surface is at least 5 microns.

In another embodiment of this aspect of the present invention, the first substrate may have a contact-bearing surface remote from the confronting surfaces.

In another embodiment of this aspect of the present invention, the plurality of channels may be disposed in dicing lanes of the second substrate.

In another embodiment of this aspect of the present invention, the dielectric material may include an adhesive.

In another embodiment of this aspect of the present invention, the dielectric material includes a partially cured dielectric material.

In another embodiment of this aspect of the present invention, at least some channels have first and second ends, and each of the channels may be exposed at least one edge of the second substrate.

In another embodiment of this aspect of the present invention, at least one of the channels contains dielectric material.

In another embodiment of this aspect of the present invention, at least two of the plurality of channels intersect.

In another embodiment of this aspect of the present invention, the first and second microelectronic elements have a rectangular shape having a plurality of edges, and at least some channels extend to at least some of the plurality of edges.

In another embodiment of this aspect of the present invention, the microelectronic elements are wafers having a shape which is at least essentially circular, and at least some channels extend to the edge of the wafers.

BRIEF DESCRIPTION OF THE DRAWINGS

FIG. 7 depicts an alternate embodiment of the substrate shown in FIGS. 1(c) and 2(c).

FIG. 8 depicts an alternate embodiment of the substrate shown in FIGS. 1(c) and 2(c).

DETAILED DESCRIPTION

Figure 1A:
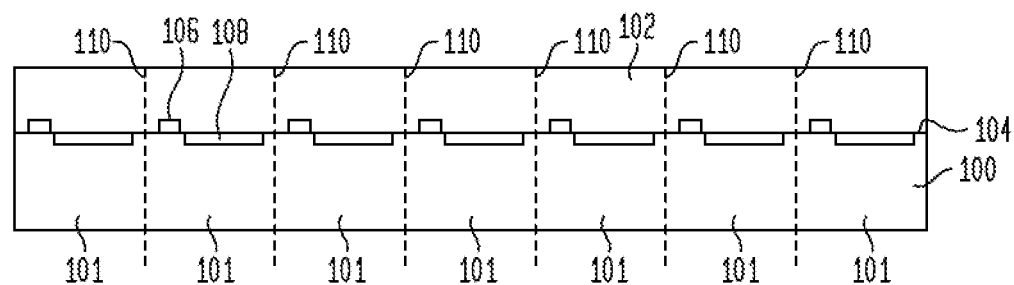
FIG. 1 (1(a)-1(g)) depicts a method of bonding wafers in accordance with one embodiment of the invention.
Figure 1B:
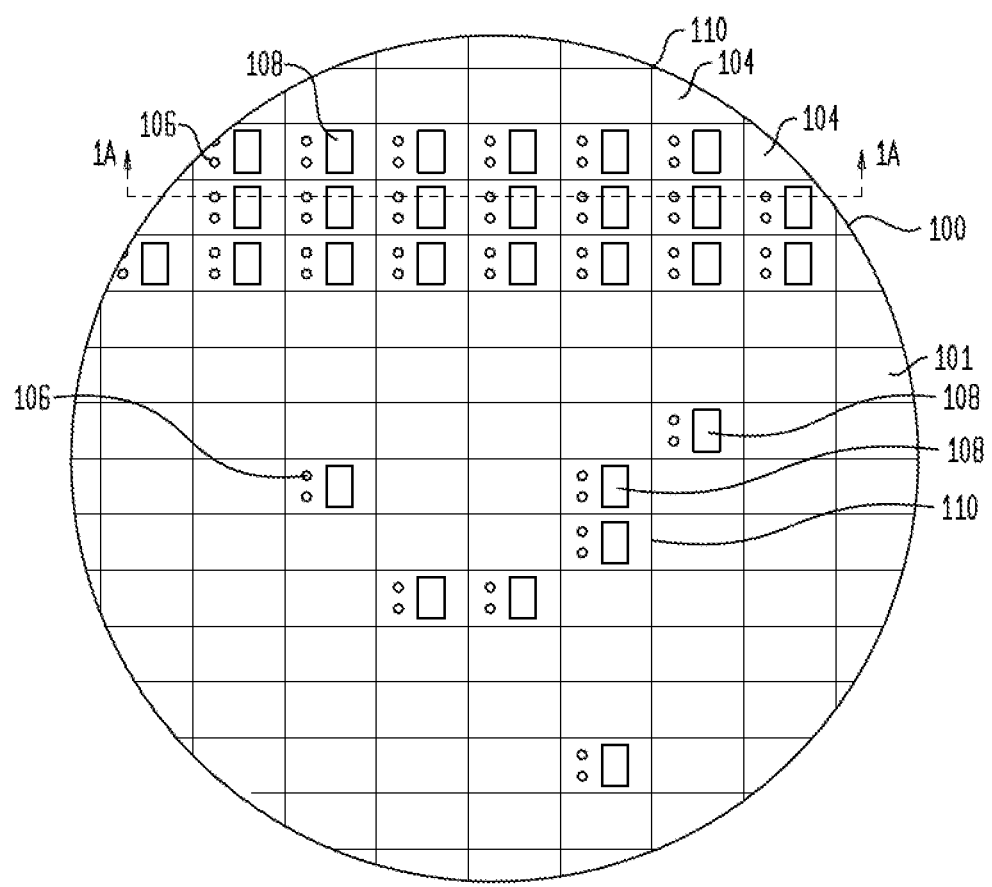

FIG. 1 represents a method of bonding substrates together in accordance with an exemplary embodiment of the present invention. Referring to FIG. 1(a), a substrate and a bonding material 102 is shown. In this embodiment, the substrate may be a wafer 100 comprised of a plurality of chips 101 attached along dicing lanes 110. Illustratively, the wafer is one of many available types of wafers which include at least a layer of semiconductor material, including but not limited to silicon, alloys of silicon, other group IV semiconductors, III-V semiconductors and II-VI semiconductors. As shown in FIG. 1(b), a top plan view of the wafer 100, each chip 101 includes a semiconductor device region 108 provided in the semiconductor device layer, which contains, for example, one or more active or passive devices formed integrally to the semiconductor material of the chip. Examples of such device include, but are not limited to a microelectronic or micro-electromechanical device such as a SAW device, MEMS device, VCO, etc., and an electro-optic device. The device region 108 of each chip 101 is conductively connected by wiring (not shown) to bond pads 106 disposed in a bond pad region at the active surface 104 of each chip 101. In some types of chips, the bond pads 108 include solder-wettable regions which are exposed at the front surface.

Referring back to FIG. 1(a), a layer of bonding material 102 may be provided on the active surface 104 of the first wafer 100. The bonding material 102 may be any type of material capable of providing a bond between two substrates. For example, adhesive material, dielectric material, or the like may be used. In one embodiment, an adhesive material, such as a polymeric material such as epoxy may be used.

Figure 1C:
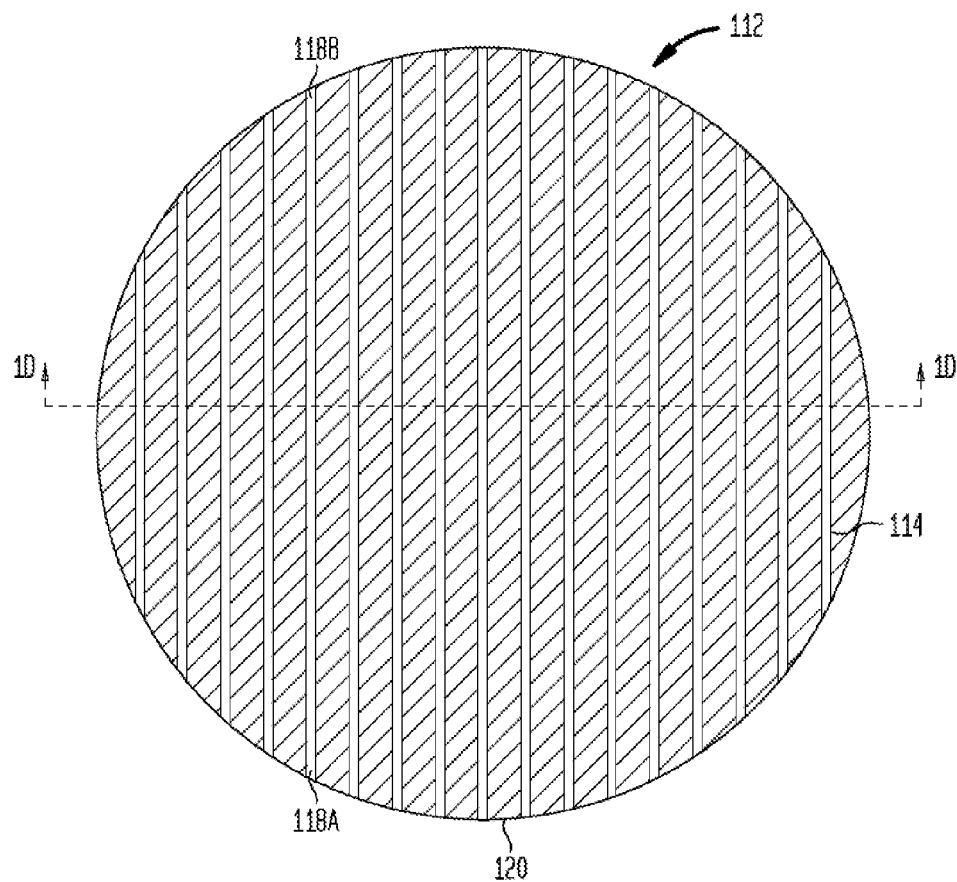
Figure 1D:
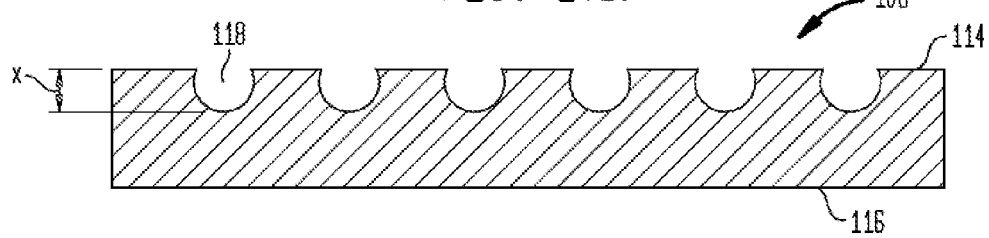

Referring now to FIGS. 1(c) and 1(d), a second wafer 112 having a front face 114 (FIG. 1(d)) and a rear face 116 (FIG. 1(d)) is shown. In this embodiment, the second wafer 112 is a round and blank wafer with no active devices thereon. As shown, channels 118 are provided on the front face 114 of the second wafer 112, although the channels 118 may alternatively be provided on either or both the front face 114 or rear face 116 of the second wafer 112. The channels may be formed within the substrate using any known method, such as by laser etching, wet etching, sandblasting, sawing, or mechanical milling, among others.

Referring back to FIGS. 1(c) and 1(d), as shown in this embodiment, the channels 118 may have a rounded profile that extends across the front face 114 of the second wafer 112. The channels 118 may also have a first end 118A and a second end 118B, each of the ends 118A, 118B adjacent the edge 120 of the second wafer 112. The channels may be aligned with saw lanes of the second wafer 112 and may have a depth X (FIG. 1(d)) of at least 5 microns measured from the front face 114 of the wafer to its lowest point. Each of the channels 118 may be uniformly shaped and spaced apart. It is to be appreciated that the channels 118 may take on any one of various shapes, sizes, and/or designs. For example, they can be distributed across one or more surfaces of the wafer and do not need to be evenly spaced apart from one another.

Figure 1E:
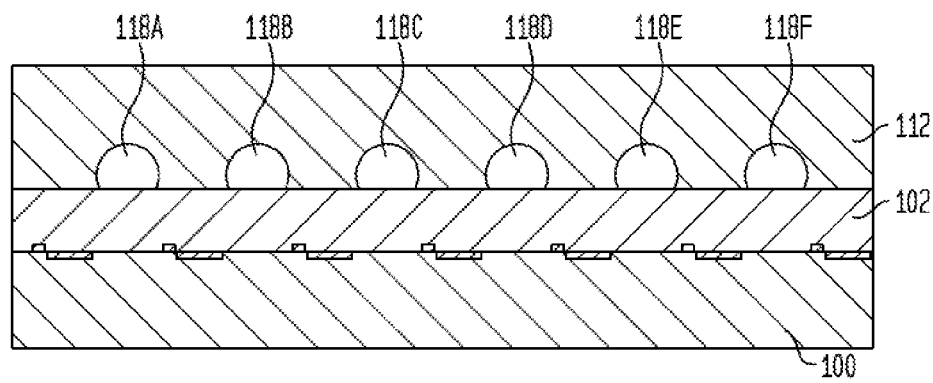

Once the first wafer 100 and second wafer 112 are prepared, they may be aligned with one another, as shown in FIG. 1(e). The second wafer 112 may be positioned to overlie the first wafer 100 and bonding material 102. The front face 114 of the second wafer 112 may face the top surface 122 of the bonding material 102 and the contact bearing surface 104 of the first wafer 100. In one embodiment, the first wafer 100 and second wafer 112 have a coefficient of thermal expansion that is less than 10 parts per million/° C. This helps to reduce any warping or inconsistencies between the first and second wafers 100,112 once the bonding material 102 is cured.

Figure 1F:
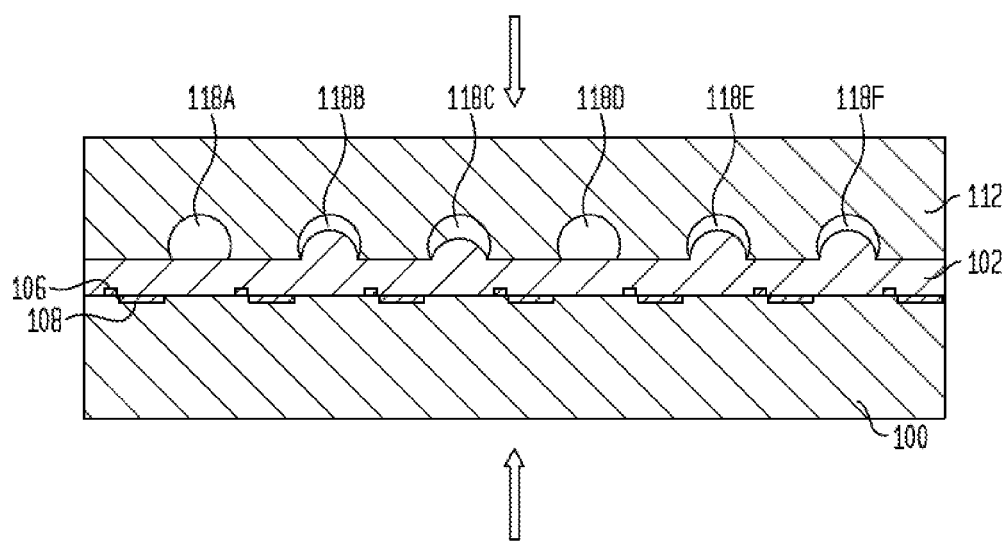

Referring now to FIG. 1(f), the temperature of the bonding material 102 may be increased to cause the bonding material 102 to flow. While the bonding material 102 is flowable, the first wafer 100 and second wafer 112 may also be pressed together in the directions shown by the arrows A1 and A2 so that they can become bonded together. It is to be appreciated that in other embodiments, force may only be applied to one of the wafers at a time. For example, force may only be applied to the first wafer 100, and the second wafer 112 will not move or be prevented from moving during pressing. Alternatively, force may only be applied to the second wafer 112, and the first wafer 100 will not move or be prevented from moving during pressing. Similarly, force could be applied to a first wafer 100, and then applied to the second wafer 112, but not both at the same time.

As the first and second wafers 100, 112 are pressed together, portions of the bonding material 102 may begin to flow into the channels 118. The channels 118 provide a passageway for any excess air or voids in the bonding material 102 to escape and for bonding material 102 to flow. As shown, since in this embodiment the channels 118 may be used to accommodate excess air and bonding material, the bonding material 102 is unlikely to fill the entire volume of a channel 118. There may be some channels 118A, 118D that have no bonding material therein, whereas other channels 118B, 118E, 118F will have partially filled channels. One or more of the channels 118C may also have less bonding material 102 than other channels 118B, 118E, 118F. Due to the fact that each of the channels 118 have at least one end that extends from the edge 120 of the second wafer 112, excess air trapped within the bonding material may flow to the outer edges of the first and second wafers 100,112 to provide for void-free bonding between the first and second wafers 100,112. After the first and second wafers 100,112 have been pressed together, the bonding material may have a thickness in which bonding forces other than Van Der Waals forces are dominant. In one example, this can be achieved by ensuring that the bonding material has a thickness over one micron.

It is to be appreciated that in this embodiment, the channels may overlie a top surface 122 of the bonding material 102, and not the bottom surface 124 of the bonding material. This is because providing channels adjacent the bottom surface 124 of the bonding material 102 would simply result in the entire volume of the channels 118 being filled with bonding material. This would prevent the channels 118 from acting for its intended purpose, i.e., providing a passageway for excess air trapped in the bonding material to escape.

The overall bonding process, which includes providing channels 118, helps to reduce voids in the bonding material 102 that may result from excess air in the system. It also helps to provide for a more planar interface between the front face 114 of the second wafer 112 and the top surface 122 of the bonding material 102, as well as the bottom surface 124 of the bonding material and the contact bearing surface 104 of the first wafer 100. Any excess air that may have been trapped in the bonding material 102 can now be squeezed into the channels 118 and evacuated from the bonding material and overall system.

Figure 1G:
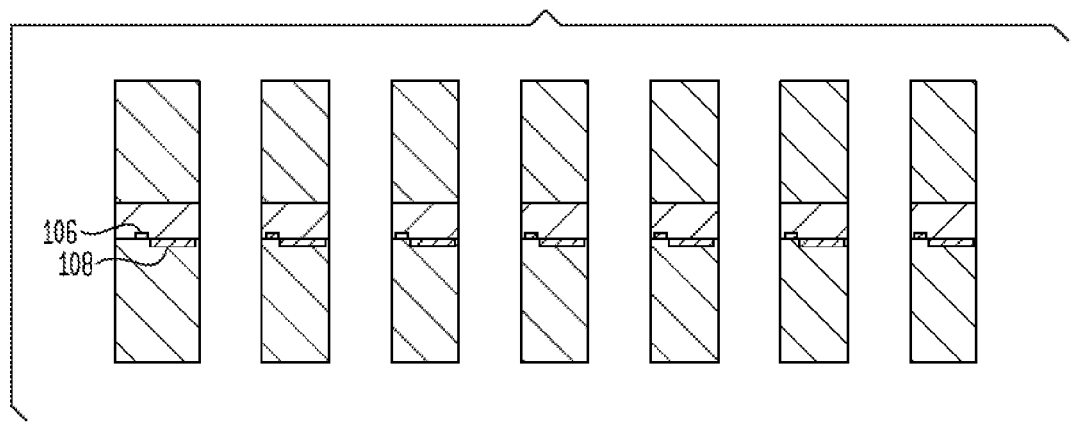

Referring to FIG. 1(g), once the excess air has been evacuated during the pressing step, the bonding material may be cured. Thereafter, the wafers are ready to be cut into individual chip devices. In one embodiment, the wafers may be cut along the channels 118 and dicing lanes 110, such that the process of cutting along the dicing lanes 110 results in the elimination of all channels 118.

Referring now to FIG. 2, there is shown an alternate embodiment of the present invention. It is to be appreciated that in FIG. 2, as well as throughout the specification, similar reference numerals will be used to identify similar elements. As shown, the steps shown in FIGS. 2(a)-2(d) are identical to the steps and structure discussed with respect to FIGS. 1(a)-1(d). As shown in FIGS. 2(a) and 2(b), a bonding material 202 overlies a first wafer 200 comprised of a plurality of chips 201 attached along dicing lanes 210. Each chip 201 may include contact pads 206 and active devices 208 therein. A second wafer 212 with channels 218 (FIGS. 2(c) and 2(d)) is also shown.

Referring now to step 2(e), in an alternative method of bonding the first and second wafers 200,212, the first wafer 200 and second wafer 212 may be aligned. In this embodiment, a spacer 209 separates the first wafer 200 and second wafer 212. As shown, the bottom surface of the second wafer 212 faces the top surface 211 of the spacer 209. The bottom surface 208 of the spacer 209 faces the active surface 204 of the first wafer 200. The pre-aligned first and second wafers 200,212 may then be placed into a vacuum chamber 226, as shown in FIG. 2(f). Referring now to FIG. 2(g), air or gas may be evacuated from the chamber and the spacer 292 may be removed. Forces may be applied to the first and second wafers 200,212 in the directions shown by the arrows A1 or A2. Turning to FIG. 2(h), as discussed above, any excess air and material may flow into and through the channels to help eliminate the presence of any voids in the bonding material that would cause the thickness of the bonding material to differ along different points on the first and second wafers 200,212. The vacuum may continue to be used to remove any excess air that has evacuated through the channels.

It is to be appreciated that in alternate embodiments, the first and second wafers 200,212 may be placed into the vacuum chamber at any point in time. For example, the first and second wafers 200,212 may be placed into the vacuum chamber 226 before or after the first and second wafers 200, 212 have been pressed together. Additionally, the vacuum chamber 226 may be operational before, during, or after pressing of the first wafer 200 and second wafer 212 together.

Figure 2A:
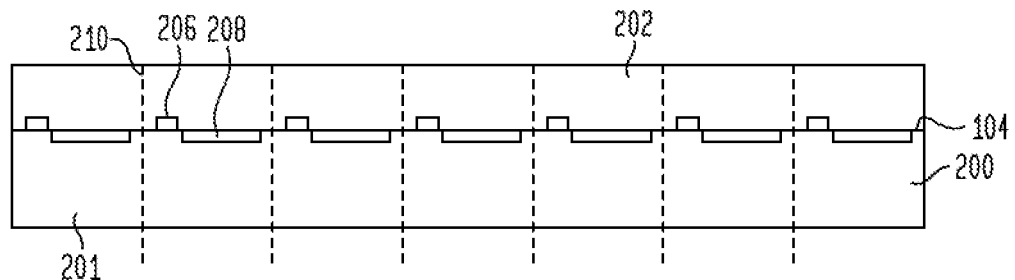
FIG. 2 (2(a)-2(i)) depicts a method of bonding wafers in accordance with another embodiment of the invention.
Figure 2B:
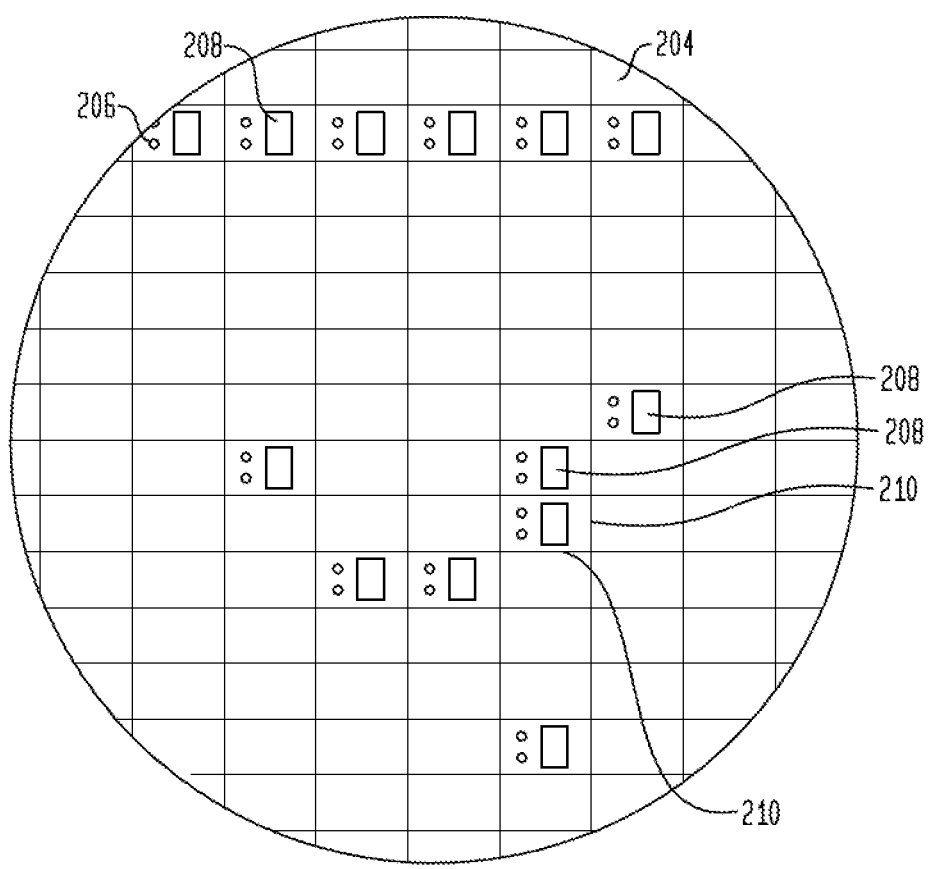
Figure 2C:
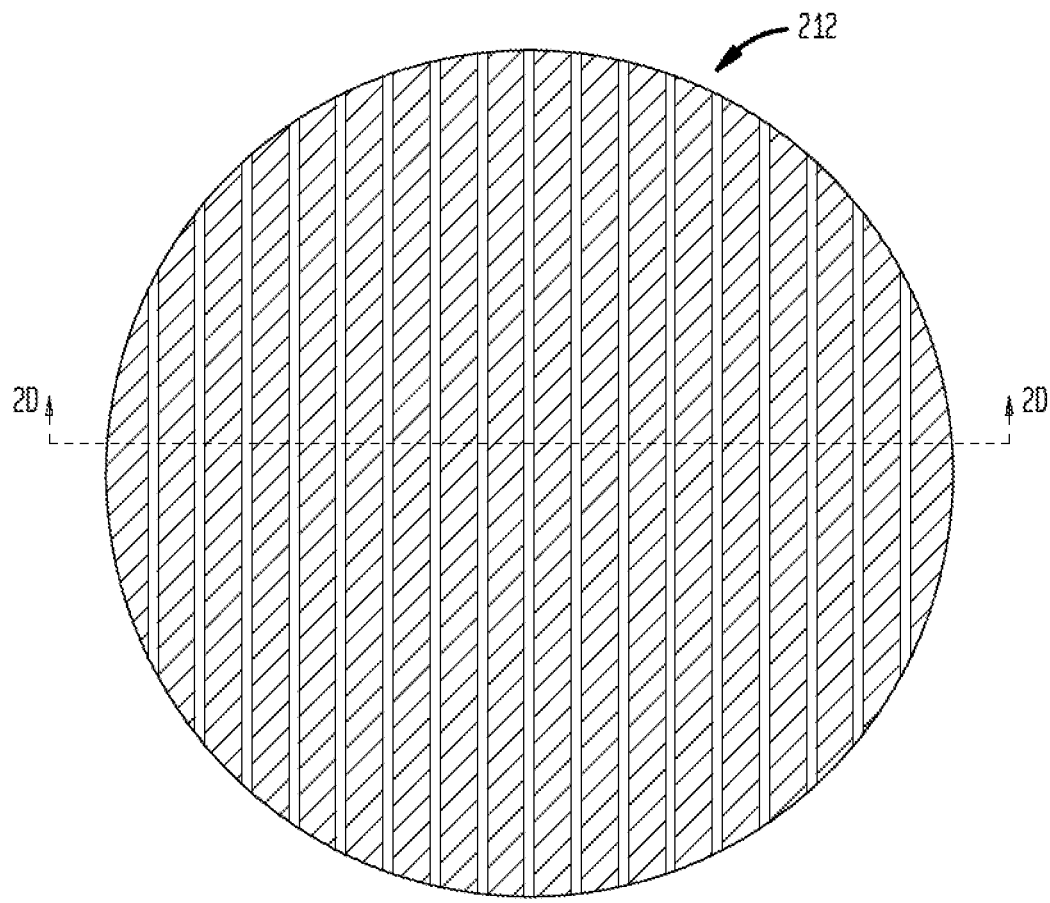
Figure 2D:
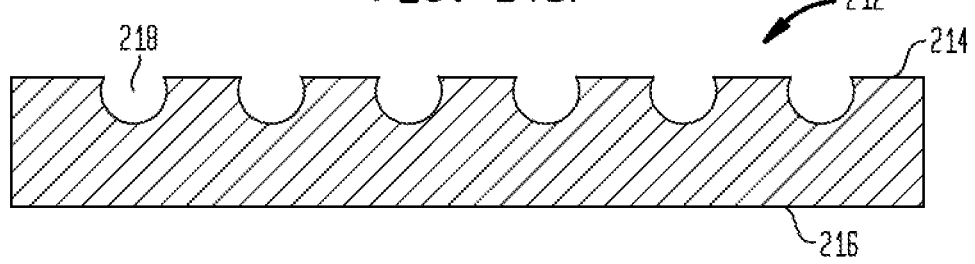
Figure 2E:
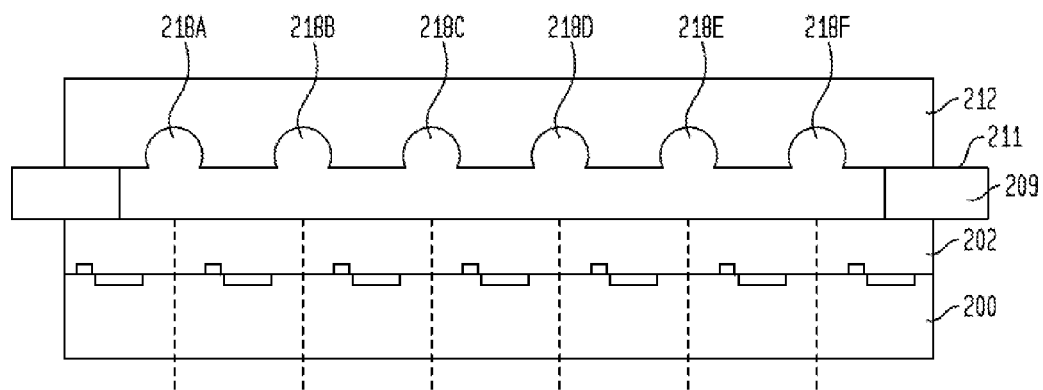
Figure 2F:
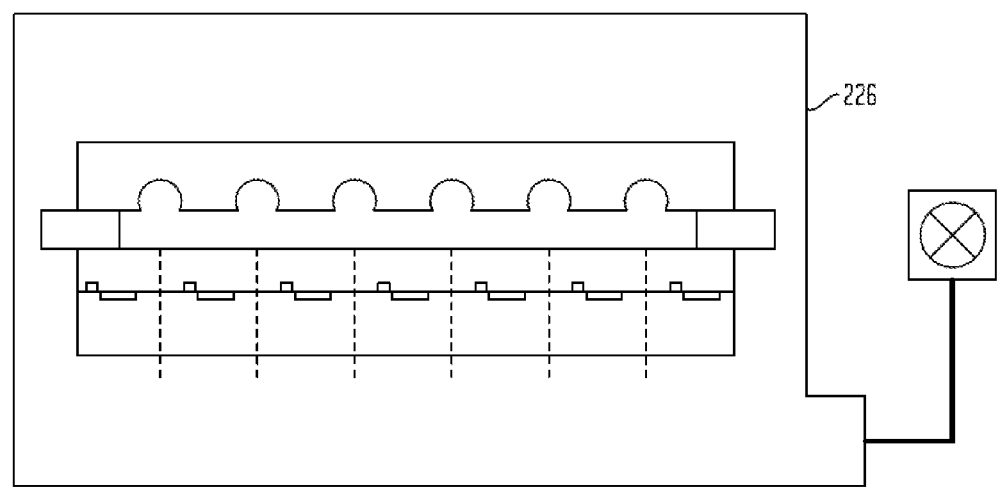
Figure 2G:
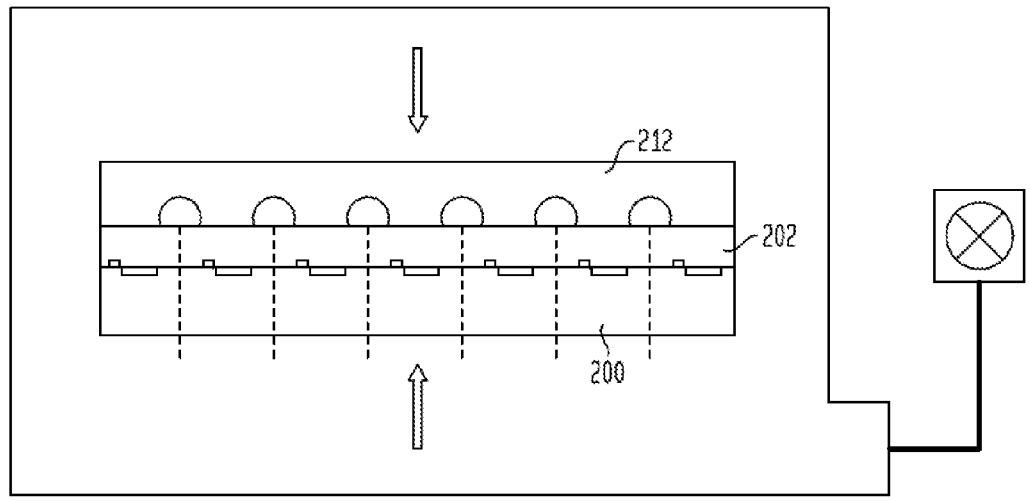
Figure 2H:
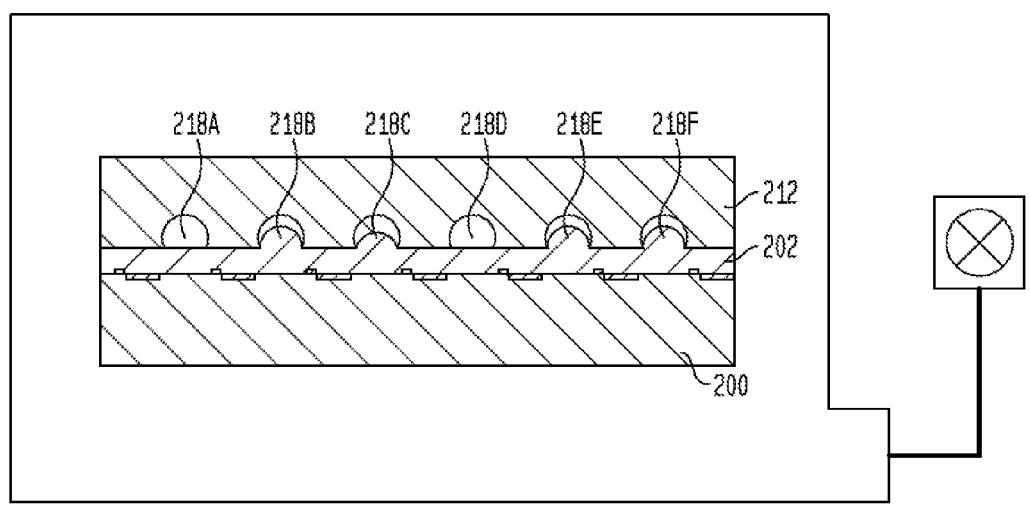
Figure 2I:
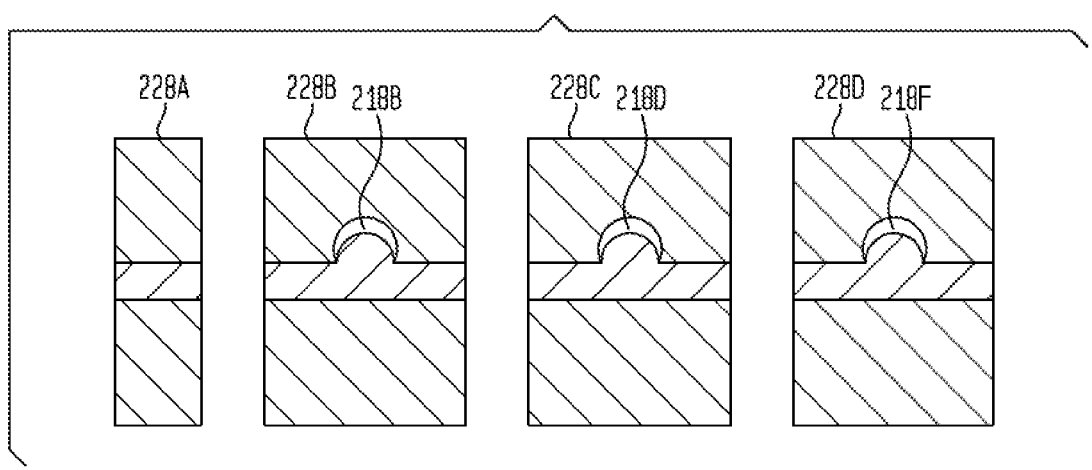

Once the first and second wafers 200,212 have been bonded together, they may be cured, and then cut into individual microelectronic devices 228A, 228B, 228C, 228D as shown in FIG. 2(i). In this example, only some of the channels 218A, 218C, 218E are removed, whereas other channels 218B, 218D, 218F will remain as part of the microelectronic devices 228B, 228C, and 228D.

As alluded to herein, the channels 118,218 (FIGS. 1(c),2(c)) play an important role in helping to achieve void-free bonding between two or more wafers. Numerous shapes, sizes, and patterns of channels 118 may be utilized in accordance with the present invention. The channels may be wide, skinny, or varied. The channels may extend in straight lines from one edge of the wafer to an opposed edge, or simply extend from only one edge of the wafer. Although not required, it is desired that at least one end of a channel is adjacent to the outer edge of the wafer, so as to allow for excess air and material to pass out of the first and second wafer combination.

Figure 3:
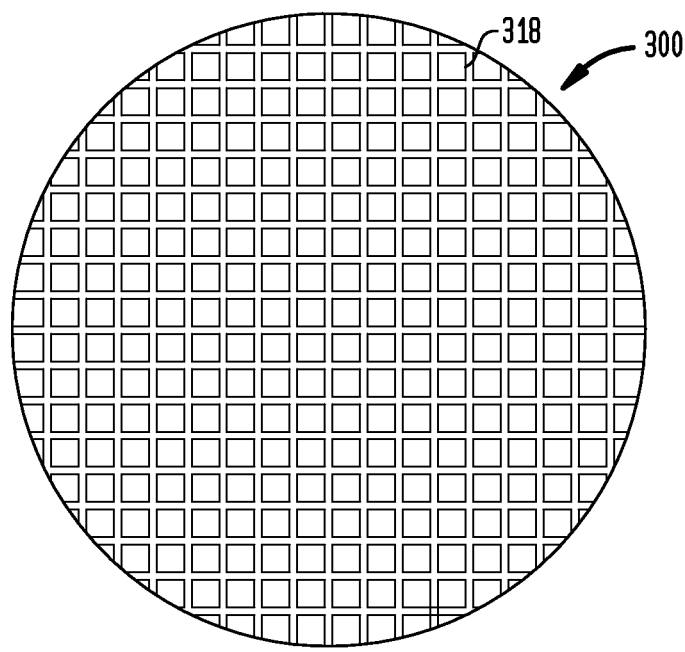
FIG. 3 depicts an alternate embodiment of the substrate shown in FIGS. 1(c) and 2(c).

FIGS. 3-10 provide a small sampling of the various embodiments of channel shapes and designs on a wafer. Referring first to FIG. 3, a wafer 300 is shown, wherein channels 318 uniformly extend in both the horizontal (x-axis) and vertical (y-axis) directions across the front face 314 of the wafer 300. The arrangement of channels provides numerous passageways for excess air and fluid to pass therethrough.

Figure 4:
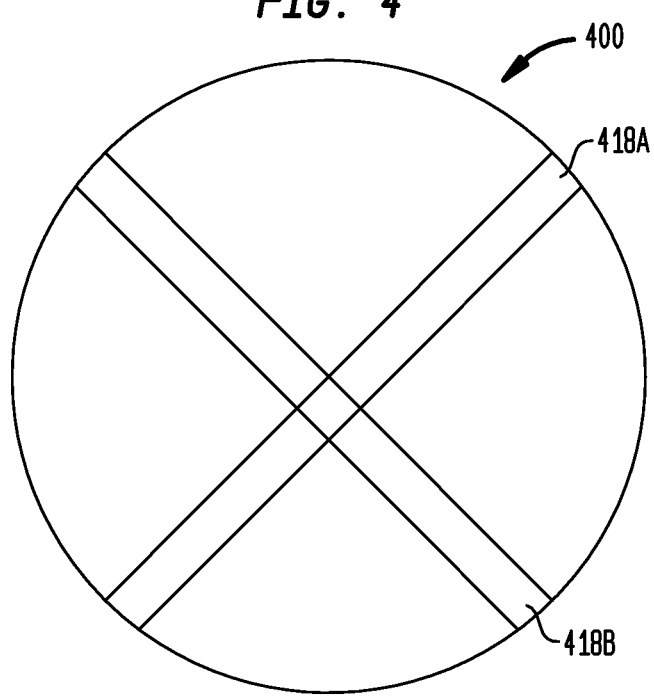
FIG. 4 depicts an alternate embodiment of the substrate shown in FIGS. 1(c) and 2(c).
Figure 5:
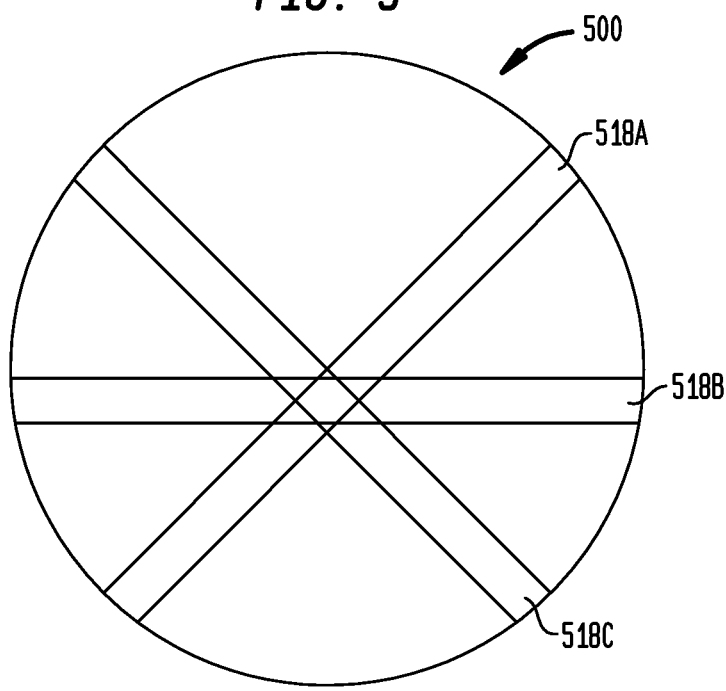
FIG. 5 depicts an alternate embodiment of the substrate shown in FIGS. 1(c) and 2(c).

Referring to FIG. 4, a wafer 400 is shown. In this embodiment, only two channels 418A, 418B are provided, each of which extend through the center of the wafer 400 and provide a diameter of the wafer 400. Similarly, as shown in FIG. 5, another wafer 500 is shown with three channels 518A, 518B, 518C extending through the center. It is, of course, to be appreciated that any number of channels can be utilized.

Figure 6:
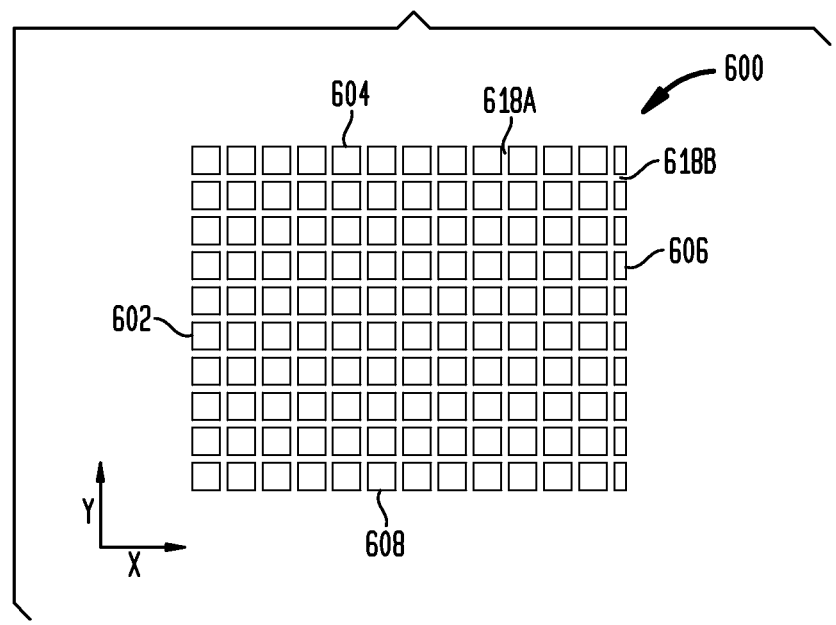
FIG. 6 depicts an alternate embodiment of the substrate shown in FIGS. 1(c) and 2(c).

Turning to FIG. 6, an alternate wafer 600 is shown. In this embodiment, the wafer 600 is in the shape of a square and has four edges: first edge 602, second edge 604, third edge 606, and fourth edge 608. Numerous channels 618 extend horizontally (x-direction) and vertically (y-direction) from one edge of the wafer to an opposed edge. For example, channel 618A extends in the vertical direction from second edge 604 to opposed fourth edge 608. Channel 618B extends from the third edge 606 to opposed first edge 602.

Another alternative wafer 700 is shown in FIG. 7. In contrast to the previous embodiment, the channels 718 only have one edge that extends to the outer edge 720 of the wafer 700. For example, channel 718A has a first outer edge 717 that is aligned at a first point 750 along the outer edge 720 of the wafer 700. Channel 718 also has a second inner edge 719 at a point within the interior of the wafer 700. Thus, the channel 718 does not extend from a first point on the outer edge 720 of the wafer to a second point along the outer edge 720 of the wafer.

Referring to FIG. 8, an alternative wafer 800 is shown wherein channels 818 may extend radially outward from the center 870 of the wafer 800 to the edge 820 of the wafer 800.

The channels 818 may be contoured such that they do not extend in straight lines from the center 870 of the wafer 800 to the outer edge 820.

Figure 9:
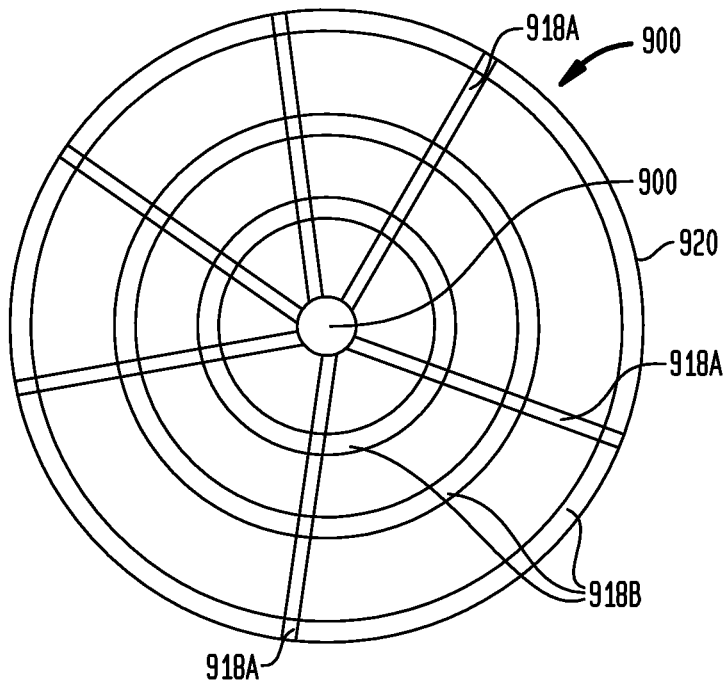
FIG. 9 depicts an alternate embodiment of the substrate shown in FIGS. 1(c) and 2(c).

Referring to FIG. 9, an alternative wafer 900 illustrates the use of both radial channels 918B and channels 918A that extend from the center of the wafer 900 to the edge 920 of the wafer 900. The arrangement of the channels 918A,918B allows for greater movement of air and any bonding material within the channels 918A,918B.

Figure 10:
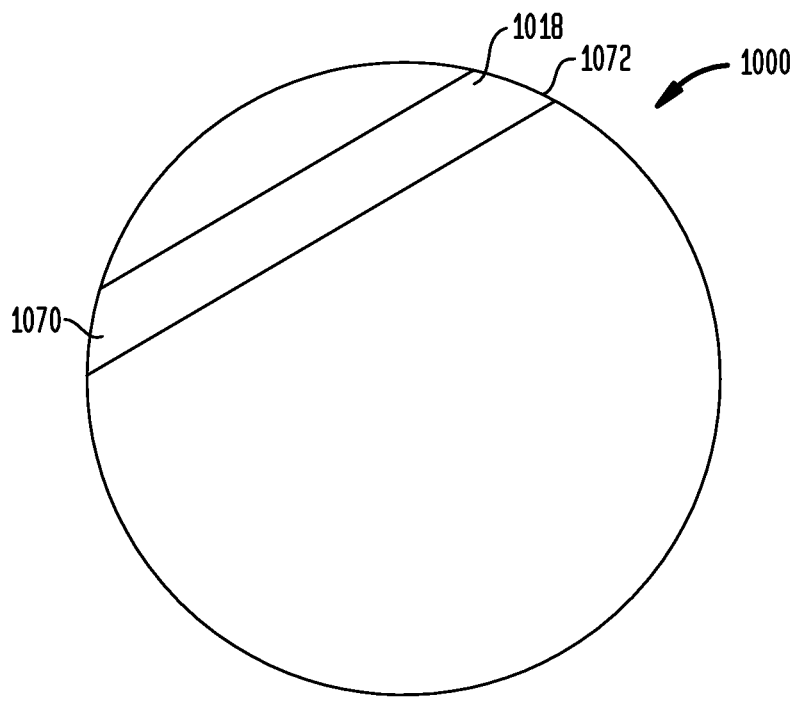
FIG. 10 depicts an alternate embodiment of the substrate shown in FIGS. 1(c) and 2(c).

Turning now to FIG. 10 in this embodiment, only a single channel 1018 is used. The channel 1018 is a chord that does not extend through the center of the wafer 1000, but merely extends from a first point 1070 on the edge 1020 of the wafer to a second point 1072 on the edge 1020.

It is to be appreciated that the presently described methods of bonding are applicable to bonding two or more wafers. Referring to FIG. 11, there is shown a microelectronic unit 1130 (FIG. 11(a)) prior to bonding. The microelectronic unit 1130 includes a first wafer 1100, a second wafer 1112 and a first bonding material 1102 interposed between the first and second wafers 1100,1112. The second wafer 1112 has a front face 1114 and a rear face 1116.

Figure 11A:
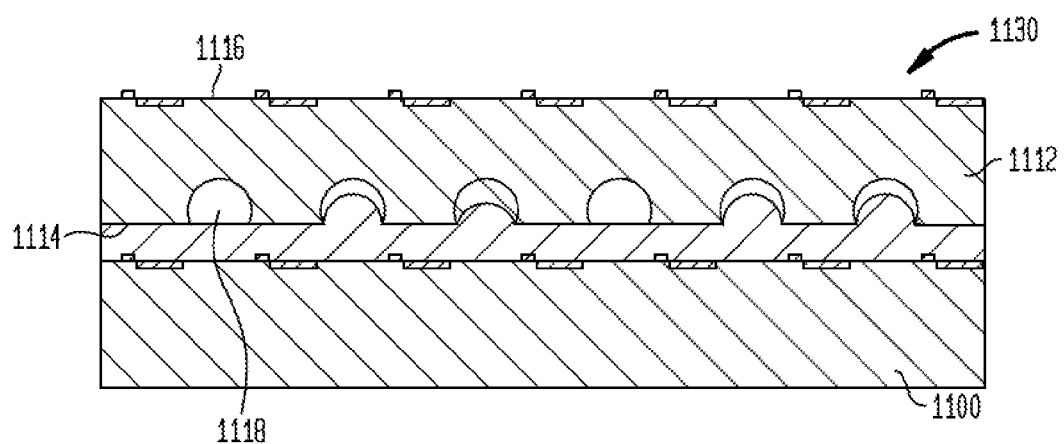
FIG. 11 (11(a)-11(d)) depicts a method of bonding substrates in accordance with another embodiment of the invention.
Figure 11B:
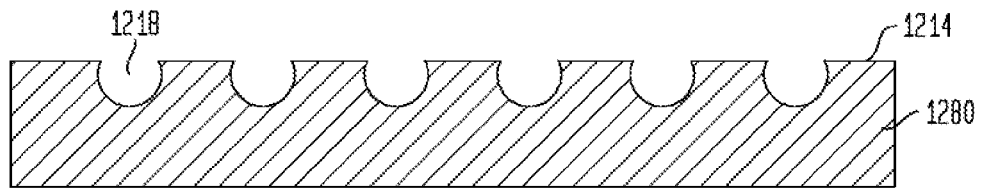
Figure 11C:
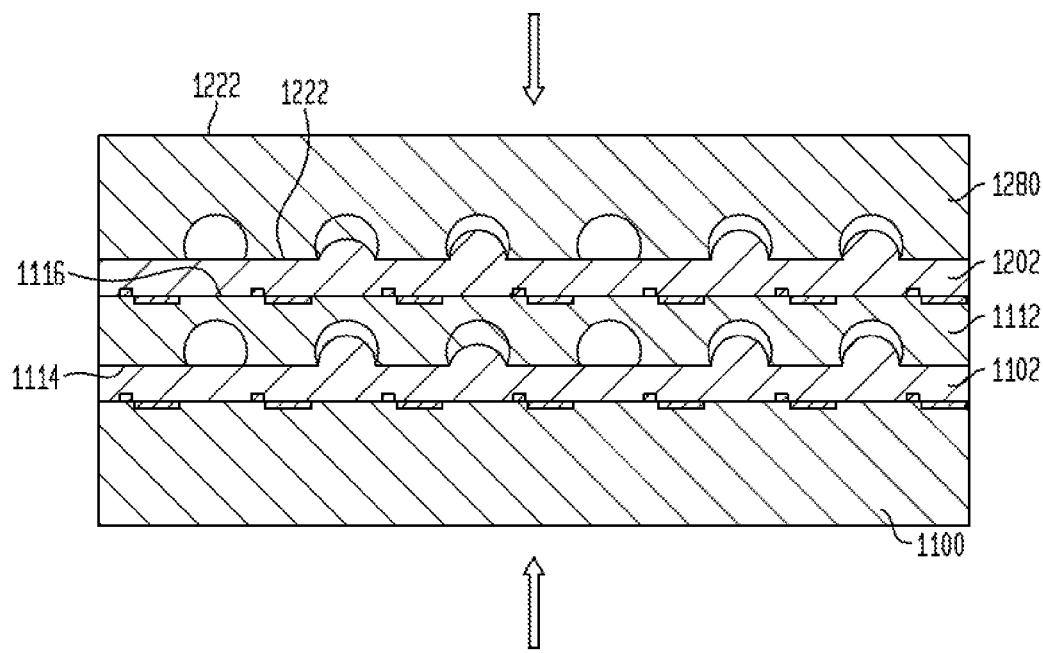

In contrast to previous embodiments, the second wafer 1112 is not a blank wafer and instead includes contacts 1106 extending away from the rear face 1116 and active devices 1108 therein. Referring to FIG. 11(b), in this embodiment, a third wafer 1280 may be a blank wafer having channels 1218 extending across its front face 1214. The third wafer 1280 may then be placed onto the unit 1130 as shown in FIG. 11(c). A second bonding material 1202 may be deposited or provided on the rear face 1116 of the second wafer 1112. The third wafer 1280 may then be placed onto the top surface 1222 of the second bonding material 1202. As in the previous embodiments, the outermost wafers may be pressed together. Here, a force may be applied in the direction of arrow A1 to the third wafer 1280. A similar force in the direction of arrow A2 maybe applied to the first wafer 1100. Pressing of the first, second, and third wafers 1100, 1112, 1280 forces excess air in the first and second bonding materials 1102, 1202 into the channels 1118 and 1218. Optionally, as previously discussed, excess air may be removed by vacuum.

Figure 11D:
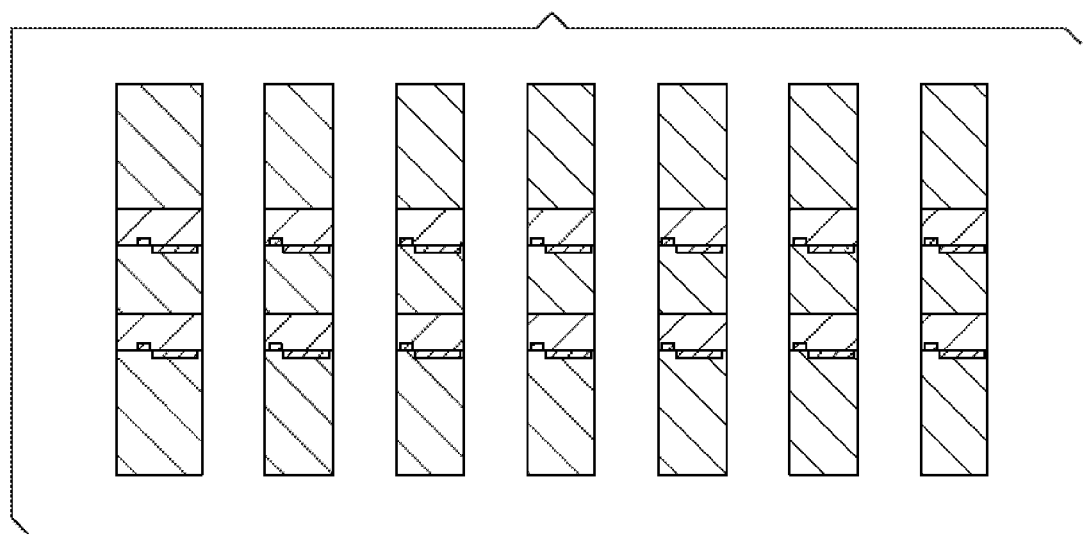

Referring to FIG. 11(d), as in the previous embodiments, the first, second, and third wafers 1100, 1112, 1280 may then be cut into individual devices.

Figure 12A:
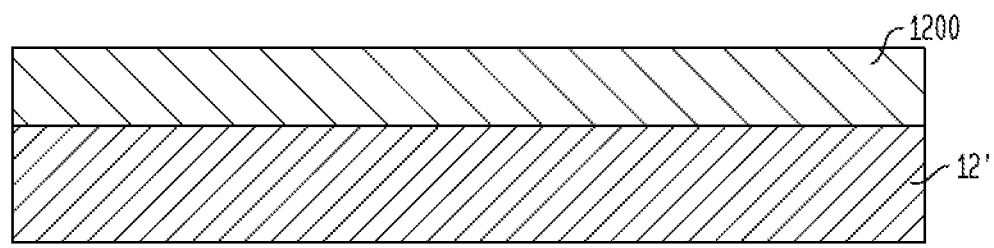
FIG. 12 (12(a)-12(b)) depicts an alternate embodiment of FIG. 1(d).
Figure 12B:
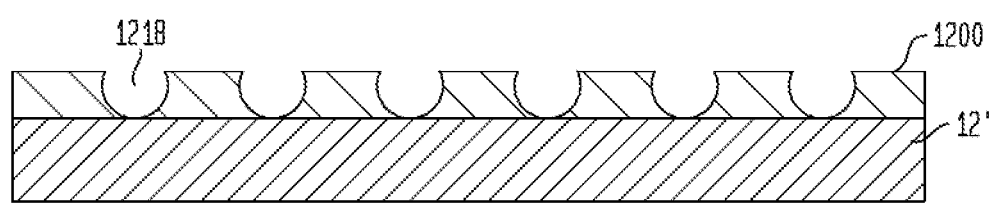
Figure 13A:
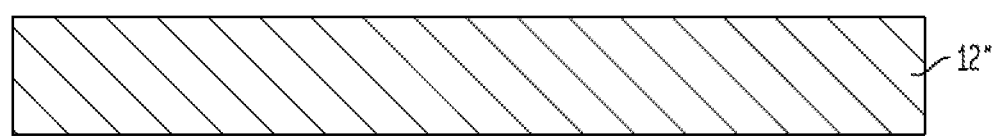
FIG. 13 (13(a)-13(b)) depicts an alternate embodiment of FIG. 1(d).
Figure 13B:
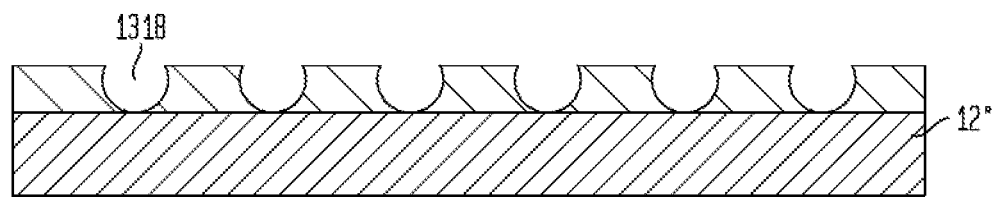

Turning to the alternate embodiment of FIGS. 12-13, there is shown alternate methods of creating channels on the wafer, as opposed to creating channels within the wafer itself. In these examples, a separate surface layer may be deposited onto a wafer that either already includes channels or from which channels can be formed. In the example shown in FIG. 12, a continuous surface layer 1200 (FIG. 12(a)) may be deposited onto the second wafer 12'. Channels 1218 (FIG. 12(b)) may be selectively formed from the surface layer 1200. In another example shown in FIG. 13, there is a wafer 12" (FIG. 13(a)). Pre-formed channels 1318 (FIG. 13(b)) may be deposited onto the wafer 12" using screen printing, lithography, dispensing, or the like.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of bonding first and second microelectronic elements, comprising:
    pressing together a first substrate containing active circuit elements therein with a second substrate, with a flowable dielectric material between confronting surfaces of the respective substrates, each of the first and second substrates having a coefficient of thermal expansion less than 10 parts per million/° C., at least one of the confronting surfaces having a plurality of channels extending from an edge of such surface, such that the dielectric material between planes defined by the confronting surfaces has a thickness over one micron, and at least some of the dielectric material flows into at least some of the channels.

2. The method of bonding as claimed in claim 1, further comprising, after the step of pressing together, placing the first and second substrates in a chamber with the flowable dielectric material therebetween and evacuating air from the chamber, so as to remove air within at least one of the flowable dielectric material or the channels.

3. The method of bonding as claimed in claim 1, further comprising before the step of pressing together, placing the first and second substrates in a chamber with the flowable dielectric material contacting at least one of the confronting surfaces, and evacuating air from the chamber.

4. The method as claimed in claim 1, wherein the first substrate has a contact-bearing surface remote from the confronting surfaces.

5. The method as claimed in claim 1, wherein the confronting surface of the first substrate is a contact-bearing surface thereof.

6. The method as claimed in claim 1, wherein the second substrate contains active circuit elements therein.

7. The method as claimed in claim 6, wherein the second substrate has a contact-bearing surface facing away from the surface having the channels.

8. The method as claimed in claim 6, wherein the plurality of channels are disposed in dicing lanes of the second substrate.

9. The method as claimed in claim 1, wherein after the pressing step, at least some of the plurality of channels are only partially filled with the flowable dielectric material.

10. The method as claimed in claim 1, wherein the dielectric material includes an adhesive.

11. The method as claimed in claim 1, wherein the dielectric material includes a partially cured dielectric material.

12. The method as claimed in claim 11, wherein the method further comprises, after the pressing step, curing the flowable dielectric material.

13. The method as claimed in claim 1, wherein at least some channels have first and second ends each exposed at at least one edge of the second substrate.

14. The method as claimed in claim 13, wherein at least two of the plurality of channels intersect.

15. The method as claimed in claim 1, wherein the microelectronic elements have a rectangular shape having a plurality of edges, and wherein at least some channels extend to at least some of the plurality of edges.

16. The method as claimed in claim 1, wherein the microelectronic elements are wafers having a shape which is at least essentially circular, wherein at least some channels extend to the edge of the wafers.

17. An in-process unit, comprising:
    first and second microelectronic elements having confronting surfaces defining respective planes and a dielectric material filling a space between the planes, at least one of the confronting surfaces having a plurality of channels extending from an edge of such surface, the dielectric material having a thickness over one micron in the space between the planes and being disposed in at least some of the channels without filling all of the channels.

18. The in-process unit of claim 17, wherein a depth of the channels from the confronting surface is at least 5 microns.

19. The in-process unit of claim 17, wherein the first substrate has a contact-bearing surface remote from the confronting surfaces.

20. The in-process unit of claim 17, wherein the plurality of channels is disposed in dicing lanes of the second substrate.

21. The in-process unit of claim 17, wherein the dielectric material includes an adhesive.

22. The in-process unit of claim 17, wherein the dielectric material includes a partially cured dielectric material.

23. The in-process unit of claim 17, wherein at least some channels have first and second ends, each of the channels exposed at at least one edge of the second substrate.

24. The in-process unit of claim 17, wherein at least one of the channels contain dielectric material.

25. The in-process unit as claimed in claim 17, wherein at least two of the plurality of channels intersect.

26. The in-process unit as claimed in claim 17, wherein the first and second microelectronic elements have a rectangular shape having a plurality of edges, and wherein at least some channels extend to at least some of the plurality of edges.

27. The in-process unit as claimed in claim 17, wherein the microelectronic elements are wafers having a shape which is at least essentially circular, wherein at least some channels extend to the edge of the wafers.

* * * * *